United States Patent [19]

Mischenko

[11] Patent Number: 4,711,361
[45] Date of Patent: Dec. 8, 1987

[54] INTERLOCKING MODULE HOUSING
[75] Inventor: Nicholas Mischenko, Mount Prospect, Ill.
[73] Assignee: Motorola, Inc., Schaumburg, Ill.
[21] Appl. No.: 858,418
[22] Filed: May 1, 1986
[51] Int. Cl.[4] .............................................. B65D 6/24
[52] U.S. Cl. .................................. 220/4 F; 220/4 C; 220/4 D; 220/80; 220/346
[58] Field of Search ............... 220/4 C, 4 D, 4 F, 80, 220/345, 346, 347, 348, 349, 350

[56] References Cited

U.S. PATENT DOCUMENTS

| 358,450 | 3/1887 | Harlbut | 220/346 |
|---|---|---|---|
| 2,549,013 | 4/1951 | Robles | 220/345 |
| 2,729,386 | 1/1956 | Haddad | 220/4 F |
| 2,860,024 | 11/1958 | Kappel | 220/346 |
| 3,054,362 | 9/1962 | Siedle | 220/4 F |
| 3,278,009 | 10/1966 | Crump | 220/345 |
| 3,302,814 | 2/1967 | Dohner | 220/80 |
| 3,450,293 | 6/1969 | Seda et al. | 220/4 F |
| 3,989,156 | 11/1976 | Lowry | 220/4 F |
| 4,225,970 | 10/1980 | Jaramillo et al. | |
| 4,313,025 | 1/1982 | Grube, Jr. | |

FOREIGN PATENT DOCUMENTS

| 2010718 | 9/1971 | Fed. Rep. of Germany | 220/345 |
|---|---|---|---|
| 808492 | 2/1959 | United Kingdom | 220/4 F |

Primary Examiner—George E. Lowrance
Attorney, Agent, or Firm—Raymond A. Jenski; Rolland R. Hackbart

[57] ABSTRACT

A housing having sides interlocking at the corners is disclosed in which covers are provided inwardly curved edges having a G-shaped cross-section which slideably mate with a curved edge and inside slot of a side structured member of the housing. Upon fastening, a volume is created within the mated joints to captivate chips and burrs generated by the fastening process.

9 Claims, 7 Drawing Figures

INTERLOCKING MODULE HOUSING

BACKGROUND OF THE INVENTION

This invention relates to an enclosure having interlocking sides and more particularly to a housing for electronic equipment in which the corner joints may be slideably mated to produce an easily assembled and disassembled housing.

Traditional techniques for housing and shielding electronic components typically employ sections of sheet metal or plastic formed in convenient shapes and fastened together by screws or other means. Such housings are generally known as miniboxes and are widely available to the public for non-critical needs. More expensive equipment, or equipment generating sufficient heat, require more elaborate housing and typically utilize a cast or extended chassis to conduct heat away from sensitive electronic components. Covers may be secured to the chassis to provide mechanical protection and electronic radio frequency (RF) shielding. An example of such an electronic equipment housing may be found in U.S. Pat. No. 4,313,025, Grube, Jr., assigned to the assignee of the present invention. Although each of the above examples are well suited to their application, a need exists for an inexpensive and easily constructed housing which provides mechanical and electrical integrity. U.S. Pat. No. 3,450,293, Seda et al. offers one solution to the need. There, a box-like structure is formed from a collapsible side walls and interlocking joints. The joints may be further secured by screws or other fasteners which wedge flanges of equal inside radii and equal outside radii together to form a seal resistant to moisture. Such a structure, however, requires a relatively tight fit between interlocking joint flanges during assembly. This tight fit makes assembly difficult and leaves little room for undesirable burrs and chips to locate when the fastener is inserted into the interlocking joint. Furthermore, any misalignment from part tolerance or chips created during assembly will be readily apparent as a gap in the mitered edge.

SUMMARY OF THE INVENTION

Therefore, it is an object of the present invention to create a housing which may be easily assembled and disassembled.

It is a further object of the present invention to utilize gaps created when easily assembled housing edges are secured with fasteners to contain the undesired chips and burrs generated by the assembly and fastening process.

It is a further object of the present invention to create an essentially pleasing external gap between covers and other members of the housing while producing an internal seal.

Accordingly, these and other objects are achieved in the present invention which encompasses the interlocking cover joint of an enclosure in which the inward curving edge of a first side having a first radius of inside curvature may be concentrically nested along the edge with an inward curving edge of a second side having a second radius of inside curvature unequal to the first. The first side of the housing also has a flange adjacent the inward curving edge and on the same surface as the inside curvature. This flange has a curved portion curved toward the edge and a lip portion at the end of the curved portion extending away from the edge. The second side of the housing has a lip and groove on the same surface as the inside curvature of the second side edge, the lip and groove shaped to receive the lip portion of the flange.

DESCRIPTION OF THE PREFERRED EMBODIMENT

Figure 1:
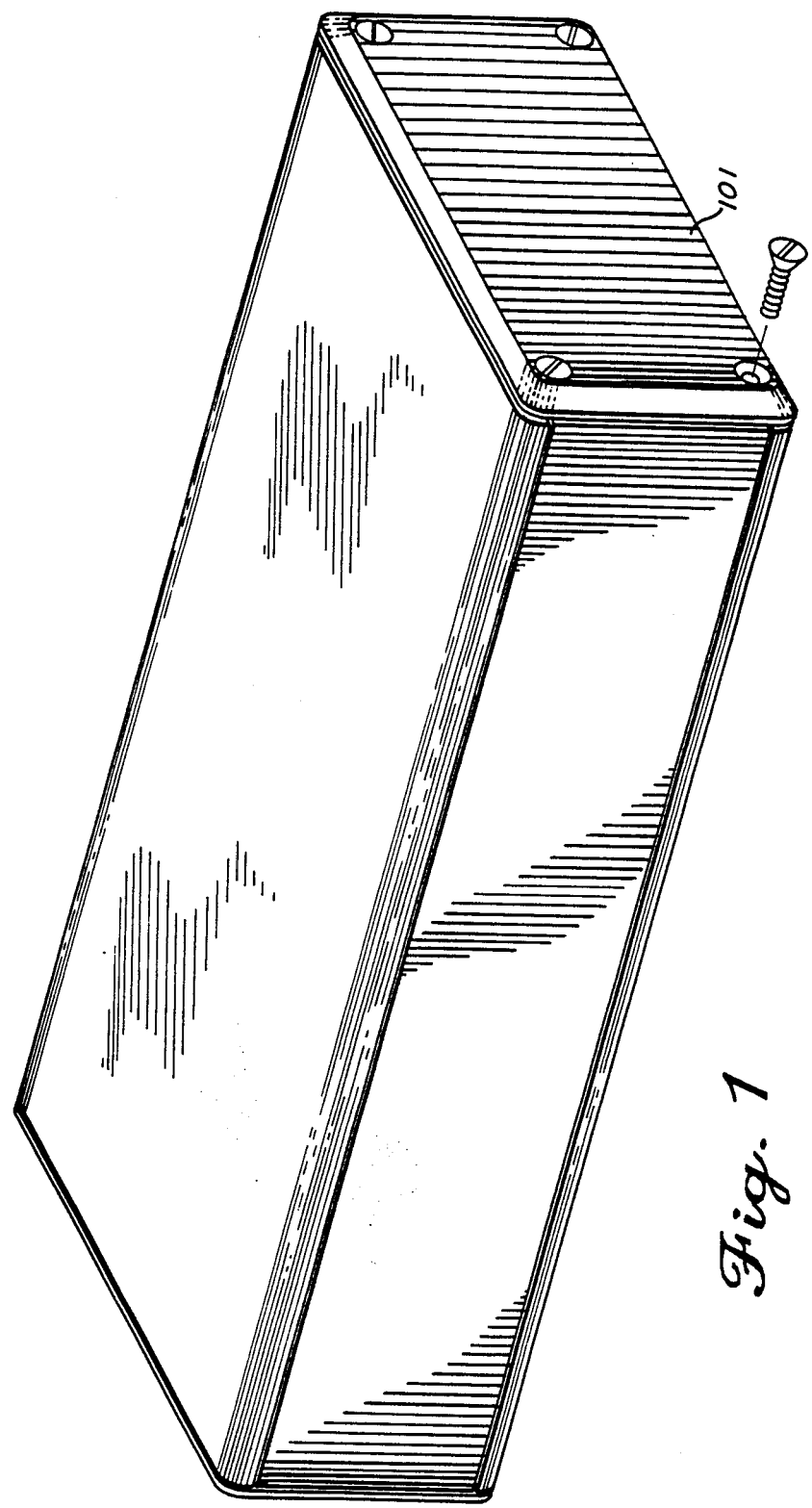
FIG. 1 is a drawing of the outside configuration of a housing which may employ the present invention.

A housing which may employ the present invention is shown in FIG. 1. Such a multisided enclosure may be employed to house electronic or other types of functions requiring rigid mechanical protection from the outside world. This housing may be similar to that disclosed in application Ser. No. 824,699 "Vehicular Radio Housing or Similar Article", filed on Jan. 31, 1986 on behalf of Anthony Scianna, Jr., et al. and assigned to the assignee of the present invention. The preferred embodiment utilizes an enclosure to house electronic components for a mobile radiotelephone. Typically, such components are secured on printed circuit boards and other mounting surfaces.

Figure 2:
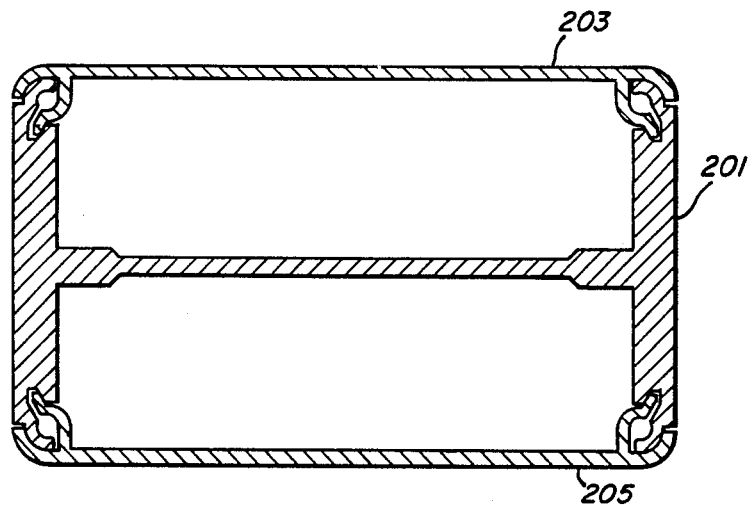
FIG. 2 is a cross-sectional drawing of the housing of FIG. 1.

FIG. 2 shows a cross-section of the housing with the end plate 101 removed. Basic structural rigidity is provided by an "H" shaped member 201 which divides the interior space into two separate chambers. These chambers may be made electrically isolated so that independent functions of a transceiver, like a receiving function and a transmitting function may be electrically isolated from each other. A top cover 203 completes the periphery of one chamber and a bottom cover 205 completes the periphery of the second chamber. Front end plate 101 and a rear end plate (not shown) complete the housing.

One key feature of the present invention is the ability of the top and bottom covers to easily slide on and off the "H" shaped member during assembly and disassembly. This feature is facilitated by the novel corner joints of the present invention. During assembly or disassembly, these joints offer small surface contact resistance as a cover plate is slid into place with the "H" shaped member. Once in place a fastener, such as a screw, realigns the axis of the cover joint portion and the "H" shaped housing joint portion to be co-linear thereby creating a secure joint. This fastener may be of any length consistent with good engagement practices, including a length extending the entire length of the edge.

Figure 3:
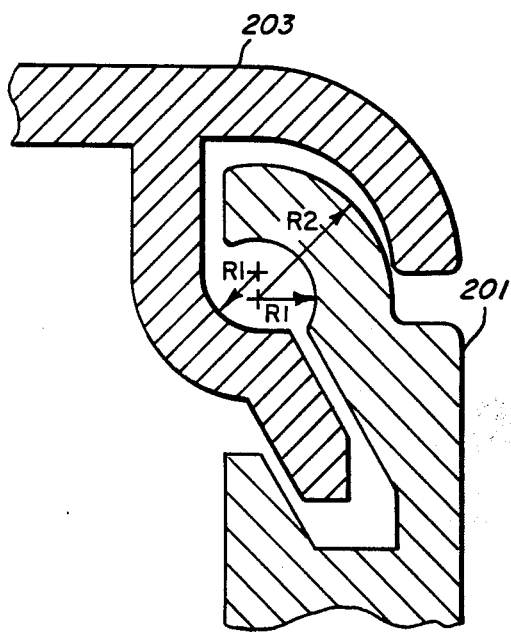
FIG. 3 is a cross-sectional drawing of the corner of the housing of FIG. 2 as the corner would appear during assembly or disassembly.
Figure 4:
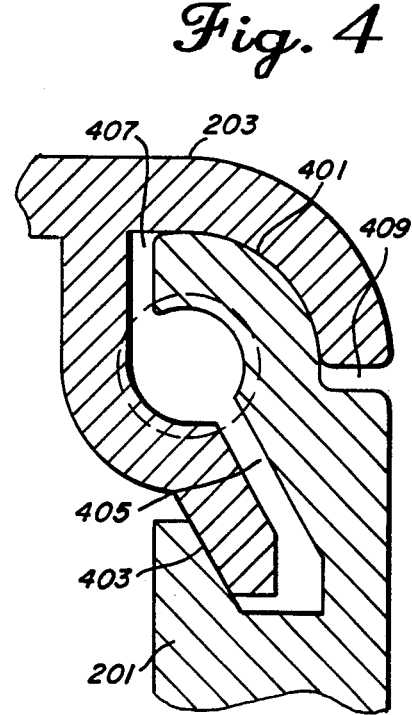
FIG. 4 is a cross-sectional drawing of the corner of the housing of FIG. 2 when the housing is secured by a screw or other fastener.

In FIG. 3, which is a cross-sectional detail of one of the housing corners, the position of a cover (for example top cover 203) and the "H" housing is shown during assembly/disassembly. The center of radius $R_1$ and $R_2$ is not coincident with the center of radius $R'_1$ and $R'_2$ during assembly. This state allows the cover 203 joint and the "H" housing 201 joint to slide past each other with a minimum amount of friction. Once in place, the radius center is forced to be coincident by a fastener and the two joints are forced securely together at points 401 and 403 as shown in FIG. 4. When the edge joint is engaged and fastened, as depicted in FIG. 4, three volumes or gaps are formed. Volumes 405 and 407 are created internal to the joint structure and have the purpose of capturing chips and burrs created during the sliding and fastening process. Volume 409, which runs the length of the edge between the cover and the "H" member, forms an asthetically pleasing gap between housing elements. Slight misalignments between housing elements are camouflaged by the gap 407.

Figure 5:
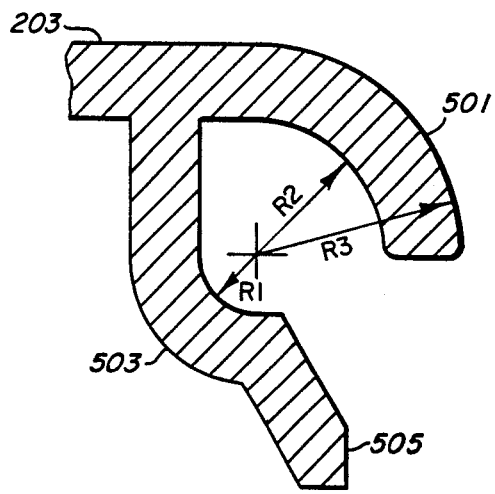
FIG. 5 is a cross-sectional drawing of the mating joint at the corner of the top and bottom covers of the housing shown in FIG. 1.

The low friction sliding joint is made possible by a novel configuration of joint elements. This configuration further enables the "H" member, the top cover 203, and the bottom cover 205 to be manufactured by continuously extruding material. Referring now to FIG. 5, a cross-sectional detail of one edge of the top cover 203 is illustrated. The other edge of top cover 203 has a mirror image cross-sectional edge. Additionally, bottom cover 205 may use an edge joint having a similar cross-section. The mating edge of top cover 203, as shown, utilizes the top surface of cover 203 curving around the corner of the housing to produce both the housing corner and the outside radius ($R_3$) of the interlocking joint. The inner surface of cover 203 has a smaller radius ($R_2$) such that a curved cover edge is formed. Although in the preferred embodiment radius $R_3$ and $R_2$ share the same center, this restriction need not be followed in practicing the present invention. The inside surface of cover 203 has a flange 503 adjacent to the curved cover edge 501 and running the length of the cover adjacent the edge 501. (Flange 503 may be discontinuous along the length of the edge 501 in an alternative embodiment). On the surface of the flange 503 directly adjacent cover edge 501 there is a curved area having a radius of curvature $R_1$ which is smaller than the radius of curvature of $R_2$ and $R_3$ and concentric with radius $R_2$. The outer surface of the flange 503 need only have a surface reasonably designed for strength and minimum intrusion into the cavity containing the electronic components. A lip attached to the edge of flange 503 extends the length of the flange alongside the curved cover edge 501. In cross-section, then, the corner joint of cover 203 takes on an essentially "G" shaped appearance.

Figure 6:
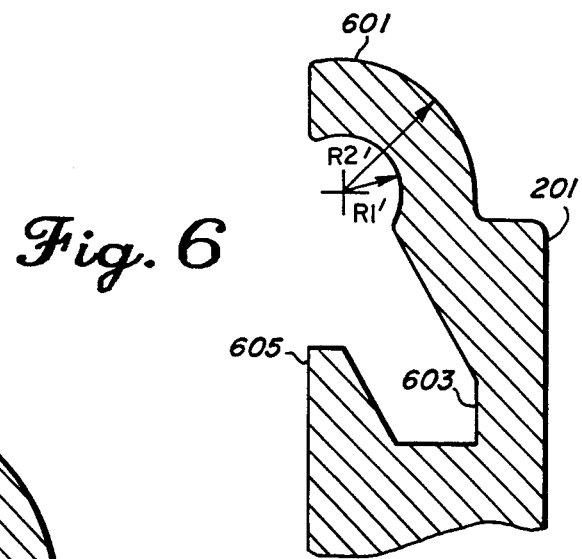
FIG. 6 is a cross-sectional drawing of the mating joint at the corners of the "H" shaped member visible in FIG. 2.

Referring now to FIG. 6, a cross-section of the "H" member illustrates the mating edge of the member. An inwardly curving surface having an outside radius of $R'_2$ and an inside radius of $R'_1$ forms the curving edge 601 of the "H" member 201. This curving edge 601 runs the entire length of the "H" member 201. The outside radius $R'_2$ is equal to the inside radius $R_2$ of cover 203 so that a nesting fit may be realized when the cover 203 and the "H" member 201 are slideably mated and secured with a fastener. The inside radius $R'_1$ is equal to the radius $R_1$ of the flange 503 of the cover 203 so that a hole is formed for insertion of a proper fastener. A groove 603 and a lip 605 are formed on the inside surface of the "H" member 201 adjacent the curved edge 601 and extending the length of the "H" member 201. The groove 603 and the lip 605 are configured such that the lip 505 of flange 503 may be slideably inserted when the cover 203 is mated with the "H" member 201. It is of particular importance to note that the groove 603 has larger dimensions than the lip 505 so that the amount of friction developed when the cover 203 is mated with the "H" member 201 is reduced and that a gap 405 (shown in FIG. 4) remains after the cover 203 and the "H" member 201 are mated and fastened. It is also important that the curved edge 601 be of a length such that a gap 407 (in FIG. 4) remain after the fastening of the cover 203 and "H" member 201. In addition to the ease of assembly allowed by gaps 405 and 407, these gaps provide a volume to contain chips and burrs which are created during mating and fastening with fasteners such as self-tapping screws.

Figure 7:
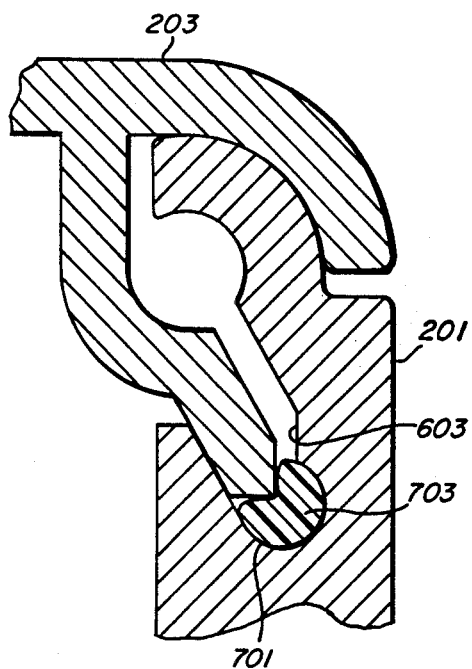
FIG. 7 is a cross-sectional drawing of an alternate embodiment of the mating joint of the corner of the housing illustrating additional volume for a gasket.

An alternative design of groove 603 includes an additional volume 701 shown in FIG. 7. This volume 701 may be used to hold additional gasketing material such as wire rope to further reduce radio frequency energy leakage or rubber gasket material to further improve waterproofing. The location of volume 701 is such that the additional gasketing material 703 contact part of lip 505 at locations other than the expected contact locations 401 and 403 between the cover 203 and the "H" member 201.

Thus, a housing for electronic equipment having low friction sliding joints has been shown and described. Upon fastening of the joint ends, the housing acquires rigidity and realizes spaces for chips and burrs to be held safely away from the electronic equipment. Therefore, while a particular embodiment of the invention has been described and shown, it should be understood that the invention is not limited thereto since many modifications may be made by those skilled in the art. It is therefore contemplated to cover any and all such modifications that fall within the true spirit and scope of the basic underlying principles disclosed and claimed herein.

I claim:

1. An interlocking corner joint for adjacent sides of an enclosure enabling the adjacent sides to be slidably mated at their edges, comprising:

an inward curving edge of a first side having a first radius of inside curvature;

an inward curving edge of a second side having an inside curvature second radius unequal to said first radius, whereby said curving edges may be concentrically nested along the length of said edges;

a flange disposed adjacent said inward curving edge of the first side, on the same first side surface as said inside curvature, and spaced from said first side edge beyond a point where said inside curvature ceases, said flange having a curved portion curved toward said first side edge and a first lip portion at the end of said curved portion extending essentially away from said first side edge; and a second lip forming a groove adjacent said inward curving edge of said second side and on the same second side surface as said inside curvature, said second lip and groove shaped to receive said first lip portion when said curving edges are concentrically nested.

2. An interlocking corner joint in accordance with claim 1 further comprising said inward curving edge of said second side having an outside curvature radius substantially equal to said first radius and said second radius smaller than said first radius.

3. An interlocking corner joint in accordance with claim 2 wherein said flange curved portion has an inside curvature substantially equal to said second radius whereby a hole extending the length of said edges is formed to accept a fastening device.

4. An interlocking corner joint in accordance with claim 3 wherein said second lip and groove are further shaped to receive a gasket.

5. A housing for electronic equipment, comprising:
a substantially planar cover having an inner and an outer surface and first and second edges disposed opposite each other, each said edge curving from said outer surface toward said inner surface with a first radius of said inner surface curvature, and said top cover having at least two flanges disposed on said inner surface, each said flange removed from an associated one of said edges to beyond a point between said first and second edges where curvature of said associated cover edge ceases, each said flange having a portion curved toward said cover edge and a first lip portion at the end of said curved portion extending away from said cover edge, whereby a G-shaped cross-section cover interlocking member is formed; and
a structural member having a substantially H shaped cross section with the vertical elements of said member forming first and second opposing sides of said housing, said member mating with at least one said cover along a horizontal edge of each said first and second sides, each said side having an edge curving toward said opposing side with an inside curvature second radius unequal to said first radius, and each side having a second lip portion disposed to contact said first lip portion when said at least one cover is mated with said structural member, thereby producing a housing having interlocking cover and sides with corners of concentric curved edges and contacting lip portions.

6. A housing in accordance with claim 5 further comprising said curving edge of each said side with an outside curvature radius substantially equal to said first radius and said second radius smaller than said first radius.

7. A housing in accordance with claim 6 wherein and said flange curved portion has an inside curvature substantially equal to said second radius whereby a hole extending the length of the interlocked cover and sides is formed.

8. A housing in accordance with claim 7 further comprises at least one end plate affixed to said interlocking cover and sides with a fastener secured in said hole formed by said flange and said side curving edge.

9. A housing in accordance with claim 5 further comprising a gasket disposed between said first lip portion and said second lip portion.

* * * * *